United States Patent [19]

Van Buskirk et al.

[11] Patent Number: 5,376,835
[45] Date of Patent: Dec. 27, 1994

[54] POWER-ON RESET CIRCUIT

[75] Inventors: Michael A. Van Buskirk, San Jose; Johnny C.-L. Chen, Cupertino; Chung K. Chang, Sunnyvale; Lee E. Cleveland, Santa Clara, all of Calif.; Antonio Montalvo, Raleigh, N.C.

[73] Assignee: Advanced Micro Devices, Inc., Sunnyvale, Calif.

[21] Appl. No.: 964,806

[22] Filed: Oct. 22, 1992

[51] Int. Cl.⁵ ............... H03K 5/153; H03K 17/22; H03K 17/687
[52] U.S. Cl. ................... 327/143; 327/198; 327/546
[58] Field of Search ............... 307/296.4, 296.5, 272.3, 307/592, 593

[56] References Cited

U.S. PATENT DOCUMENTS

| | | | |
|---|---|---|---|
| 4,788,462 | 11/1988 | Vesce et al. | 307/296.4 |
| 4,818,904 | 4/1989 | Kobayashi | 307/296.5 |
| 4,886,983 | 12/1989 | Taka | 307/296.5 |
| 5,177,375 | 1/1993 | Ogawa et al. | 307/272.3 |
| 5,214,316 | 5/1993 | Nagai | 307/296.4 |
| 5,243,233 | 9/1993 | Cliff | 307/296.4 |
| 5,287,011 | 2/1994 | Koshikawa et al. | 307/272.3 |

*Primary Examiner*—Willis R. Wolfe
*Attorney, Agent, or Firm*—Davis Chin

[57] ABSTRACT

A power-on reset circuit for generating and maintaining a reset signal in an active low state during power-up until a power supply voltage exceeds a predetermined level includes a resetting circuit (12a) and a control logic circuit (12b). The reset circuit is responsive to a monitoring signal, a start-up signal and a reference voltage for generating a reset signal which is initially in the active low state. The reset circuit includes a differential comparator (54) having a first input for receiving the start-up signal, a second input for receiving the reference voltage, and an output for generating the reset signal. The control logic circuit is responsive to the monitoring signal and the reset signal for generating a logic control signal which is initially in a high state. The differential comparator is responsive to the control signal and is activated only after the power supply voltage has exceeded a predetermined level so as to maintain initially the reset signal on its output in the low state. The output of the differential comparator is forced to a high state after the monitoring signal has reached a low state and the start-up signal exceeds the reference voltage. Logic and/or memory circuitry (18) is provided which responds to the reset signal so as to force its outputs to a known logic state.

20 Claims, 3 Drawing Sheets

POWER-ON RESET CIRCUIT

BACKGROUND OF THE INVENTION

This invention relates generally to power-up reset circuits and more particularly, it relates to an improved power-on reset circuit which includes means for maintaining a reset signal in an active low state during the initial power-up until after the power supply voltage exceeds a predetermined level and means for automatically turning off the reset circuit after the predetermined level has been reached.

In a variety of digital integrated circuit components such as flip-flops, latches, counters, and memory state registers or the like, the outputs thereof can have two or more stable states. It is often desirable to initialize or reset these types of components to a particular known logic state prior to their normal operation every time when power is first applied. As is generally well-known, this initialization process is commonly achieved by a reset signal which is applied for a brief period of time after the power is turned on to reset or initialize the outputs of the digital integrated circuit components. Thus, proper initialization insures the operating state of the various logic elements in the digital components and also simplifies test procedures to be performed thereon.

It is generally desirable to minimize the time during which the reset signal is active to the shortest time required for initializing the various components in order that they become functional as quickly as possible. It is also desirable to have the power-up rest circuit be turned off after the duration of the reset signal so as to conserve power consumption. In order to reduce space, it would be expedient to have the power-up reset circuit formed as a part of the same monolithic semiconductor integrated circuit chip containing the logic and/or memory circuits.

SUMMARY OF THE INVENTION

Accordingly, it is a general object of the present invention to provide an improved power-on reset circuit which is relatively simple and economical to manufacture and assemble, but yet overcomes the problems encountered in the prior art reset circuits.

It is an object of the present invention to provide an improved power-on reset circuit which includes means for maintaining a reset signal in an active low state during the initial power-up until after the power supply voltage exceeds a predetermined level.

It is another object of the present invention to provide an improved power-on reset circuit which includes means for automatically turning off the reset circuit after the power supply voltage has exceeded a predetermined level.

It is still another object of the present invention to provide an improved power-on reset circuit which is formed as part of the same monolithic semiconductor integrated circuit chip containing logic and/or memory circuits.

In carrying out the above and other objects and advantages of the present invention, there is provided a power-on reset circuit for generating and maintaining a reset signal in an active low state during power-up until a power supply voltage exceeds a predetermined level. The power-on reset circuit includes a resetting circuit and a control logic circuit. A power supply node is provided to receive a power supply voltage. The resetting circuit is responsive to a monitoring signal, a start-up signal and a reference voltage for generating a reset signal which is in an active low state. The resetting circuit is coupled to the power supply voltage and includes a differential comparator having a first input for receiving the start-up signal, a second input for receiving the reference voltage, and an output for generating the reset signal.

The control logic circuit is responsive to the monitoring signal and the reset signal for generating a logic control signal which is initially in a high state. A voltage divider circuit is provided for generating the start-up signal which is coupled to the first input of the differential comparator. The differential comparator is responsive to the control signal and is activated only after the power supply voltage has exceeded a predetermined level so as to maintain initially the reset signal on its output in the low state. The output of the differential comparator is forced to a high state only after the monitoring signal is determined to be in a low state and the start-up signal exceeds the reference voltage. Logic and/or memory circuits are responsive to the reset signal for setting its output thereof to a low state and for generating said monitoring signal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
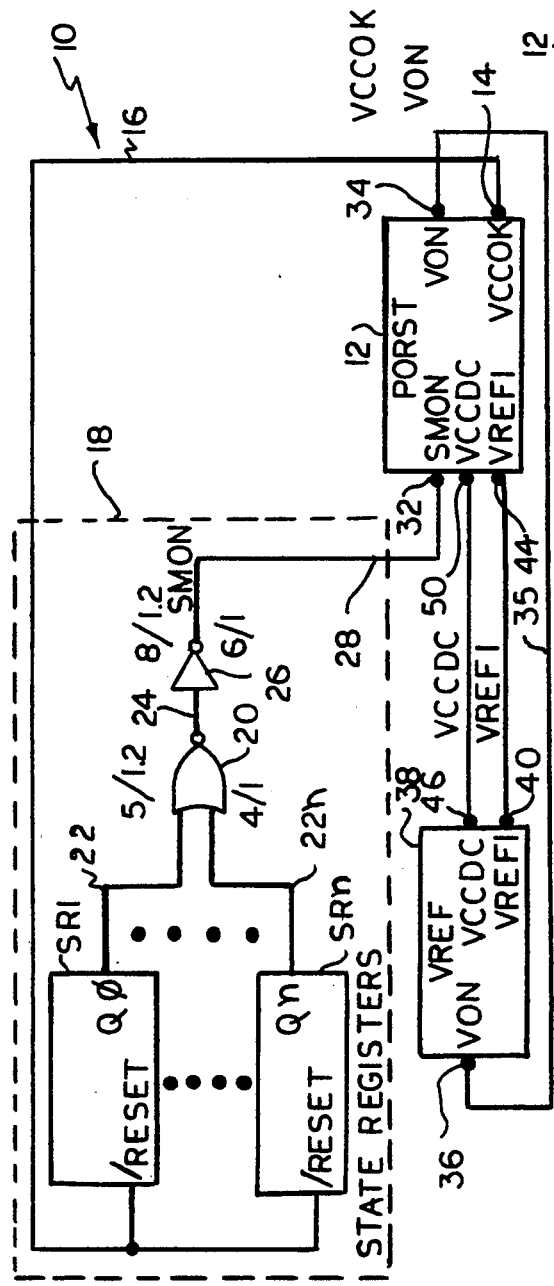
FIG. 1 is a block diagram of a monolithic semiconductor integrated circuit chip which includes a power-on reset circuit, constructed in accordance with the principles of the present invention.

Referring now in detail to the drawings, there is shown in block diagram form in FIG. 1 a monolithic semiconductor integrated circuit chip 10 which includes a power-on reset circuit 12 constructed in accordance with the principles of the present invention. The power-on reset circuit 12 provides a reset signal VCCOK on its first output terminal 14 which is coupled via line 16 to logic and/or memory circuitry 18 containing a state machine having state registers SR1, SR2, ... SRn. The logic and/or memory circuitry 18 is formed as a part of the same monolithic semiconductor integrated circuit chip 10. The reset signal VCCOK is a logic signal and initiates a reset to the reset inputs of the state registers SR1, SR2, ... SRn when it is at a low or "0" logic level (active state). The reset is inactive or turned off from the state registers when the reset signal VCCOK is at a high or "1" logic level.

The true output QΦ through Qn of the respective state registers SR1 through SRn are connected to a corresponding input of a NOR logic gate 20 via lines 22a–22n. The output of the logic gate 20 on line 24 is fed to the input of an inverter gate 26. The output of the inverter gate on line 28 provides a state monitoring signal SMON which is connected to a first input terminal 32 of the power-on reset circuit 12.

The power-on reset circuit 12 includes a second output terminal 34 which provides a logic control signal VON. The logic control signal VON is fed via line 35 to an input terminal 36 of a voltage reference generator 38. The voltage reference generator 38 is also formed of a part of the same monolithic semiconductor integrated circuit chip 10. The reference generator 38 generates a stable reference voltage VREFI on its first output terminal 40 which is fed via line 42 to a second input terminal 44 of the power-on reset circuit 12. The reference generator 38 also provides a start-up signal VCCDC on its second output terminal 46 which is fed via line 48 to a third input terminal 50 of the power-on reset circuit 12.

Figure 2:
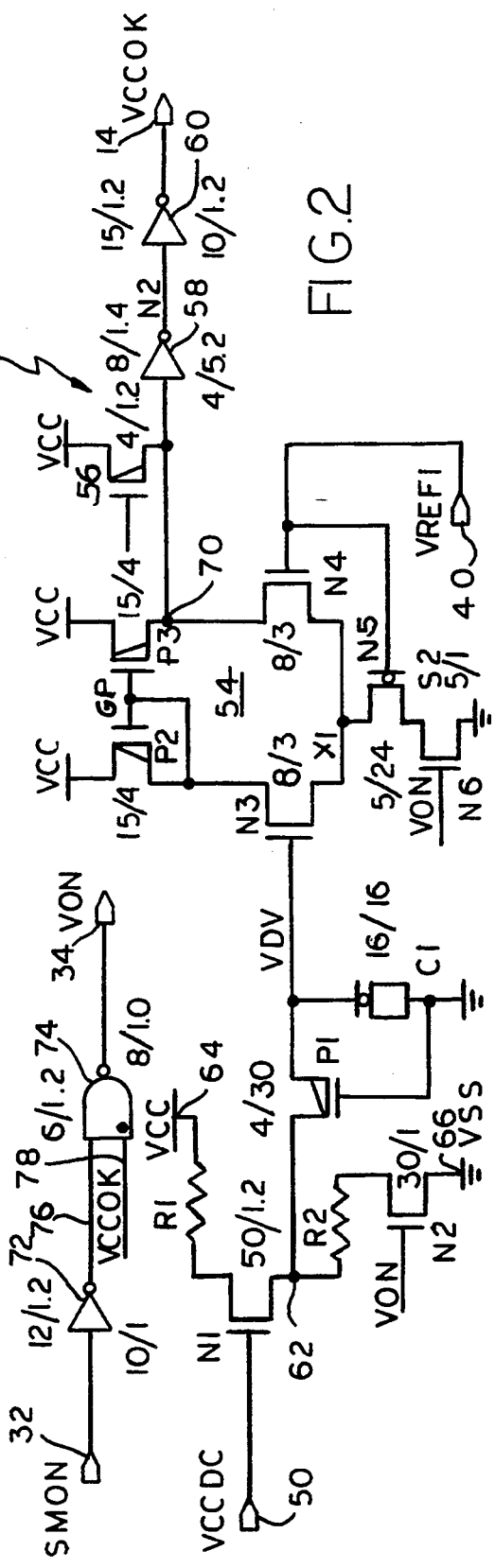
FIG. 2 is a schematic circuit diagram of the power-on reset circuit of FIG. 1.

Referring now to FIG. 2, there is illustrated a schematic circuit diagram of the power-on reset circuit 12 of FIG. 1. The power-on reset circuit 12 is formed of a resetting circuit 12a and a control logic circuit 12b. The resetting circuit 12a includes an input charging circuit 52, a voltage reference signal VREFI, a differential comparator 54, a clamping transistor 56, and a pair of inverters 58, 60. The input charging circuit 52 includes a first N-channel charging transistor N1, a voltage divider formed of resistors R1, R2, and an N-channel control transistor N2. The charging transistor N1 has its drain connected to one end of the resistor R1, its gate connected to receive the start-up signal VCCDC, and its source connected to an internal node 62. The other end of the resistor R1 is connected to a first power supply node 64 for receiving a power supply voltage or potential VCC. The control transistor N2 has its drain connected to one end of the resistor R2, its gate connected to receive the logic control signal VON, and its source connected to a second power supply node 66 for receiving a power supply voltage or potential VSS (which is at ground potential or zero volts).

A delay circuit is formed of a P-channel transistor P1 and a MOS capacitor C1. The transistor P1 has its source connected to the node 62, its gate connected to the ground potential VSS, and its drain connected to a node 68. One side of the capacitor C1 is connected to the node 68, and the other side of the capacitor C1 is connected to the ground potential.

The differential comparator 54 includes an input transistor N3, a reference transistor N4, a current source transistor N5, a control transistor N6, and load transistors P2, P3. The gate of the input transistor N3 is connected to the node 68 for receiving a voltage VDC. The gates of the reference transistor N4 and the current source transistor N5 are connected to receive the reference voltage VREFI. The gate of the control transistor N6 is connected to receive the logic control signal VON. The output node 70 of the comparator is connected to the input of the inverter 58. The output of the inverter 58 is connected to the input of the inverter 60. The output of the inverter 60 provides the reset signal VCCOK on the first output terminal 14. The sources of the load transistors P2, P3 and the clamping transistor 56 are connected to the first power supply node 64. The clamping transistor 56 has its gate connected to receive the logic control signal VON and its drain connected to the input of the inverter 58.

The control logic circuit 12b includes an inverter 72 and a NAND logic gate 74. The input of the inverter 72 defining the first input terminal 32 of the power-on reset circuit 12 receives the state monitoring signal SMON. The output of the inverter 72 is connected a first input of the logic gate 74 via line 76. The logic gate 74 has a second input on line 78 for receiving the reset signal VCCOK. The output of the logic gate 74 is connected to the second output terminal 34 of the reset circuit 12 and generates the logic control signal VON.

Figure 3:
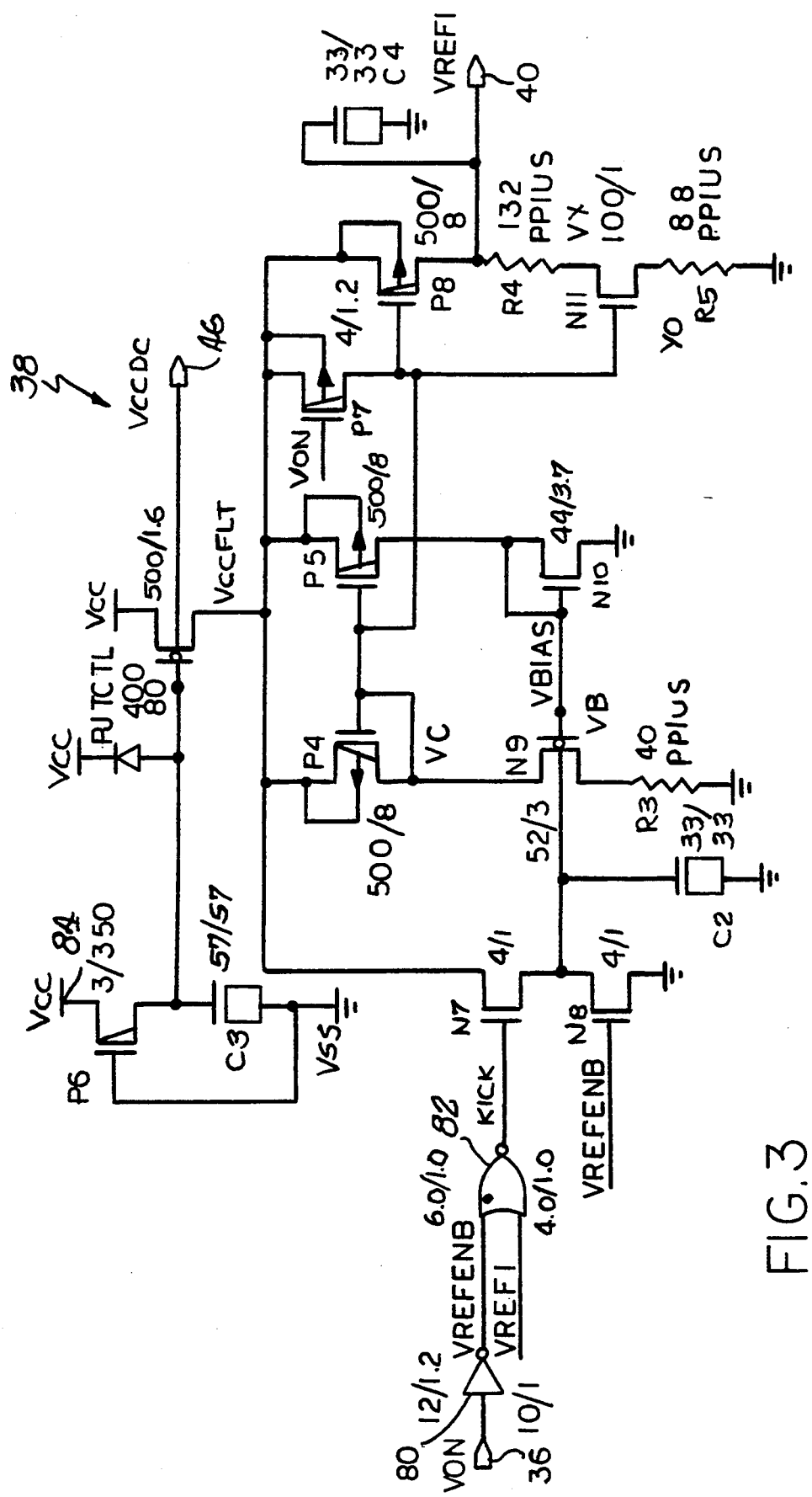
FIG. 3 is a schematic circuit diagram of the reference generator circuit of FIG. 1.

In FIG. 3 of the drawings, there is illustrated a schematic circuit diagram of the reference generator 38 of FIG. 1. The reference generator circuit includes an inverter 80, a NOR logic gate 82, a start-up transistor N7, an enable transistor N8, a capacitor C2, a resistor R3, a first current source branch formed of transistors P4, N9, and a second current source branch formed of transistors P5, N10. The reference generator circuit also includes a RC noise filter formed by a long P-channel transistor P6 and a MOS capacitor C3. The transistor P6 has its source connected to a node 84 for receiving the first power supply potential VCC, its gate connected to the ground potential VSS, and its drain connected to one side of the capacitor C3 and to the second output terminal 46 for generating the start-up signal VCCDC. The other side of the capacitor C3 is connected to the ground potential.

The reference generator cireuit further includes output transistors P7, P8 and N11, a trimming resistor R4, a load resistor R5, and a capacitor C4. It should be understood that the size of the resistor R4 could be varied in any number of ways so as to change its resistance value and thus the voltage level of the reference voltage VREFI on the first output terminal 40. The reference voltage generator has been implemented so that the reference voltage VREFI is substantially independent of variations in process parameters, temperature, and power supply voltage.

When the state registers in FIG. 1 are on (non-reset state) and the reset signal VCCOK is low, the logic control signal VON will be high so as to cause the enable signal VREFENB to be low thereby turning on the reference generator circuit 38. In particular, when the signals VREFENB and VREFI are both low, the output of the NOR logic gate 82 will be high turning on the start-up transistor N7. As a result, the gates of the transistors N9 and N10 are pulled up so as to initiate current to flow through the current source transistors P4, P5 and the resistor R3. It should be understood that when the reference voltage VREFI reaches a certain level, the output of the NOR gate 82 will go low so as to turn off the start-up transistor and the current flowing through the current source transistor P5 will be settled. The current flowing in the current source transistor P5 is mirrored to the output transistor P8 so as to pull up quickly the reference voltage VREFI at the node 40. When the output transistor N11 is finally turned on, the current flowing in the transistor P8 will cause the reference voltage VREFI to be developed across the resistors R4 and R5. Typically, this reference voltage VREFI will be stabilized at approximately +2.0 volts.

Figure 4:
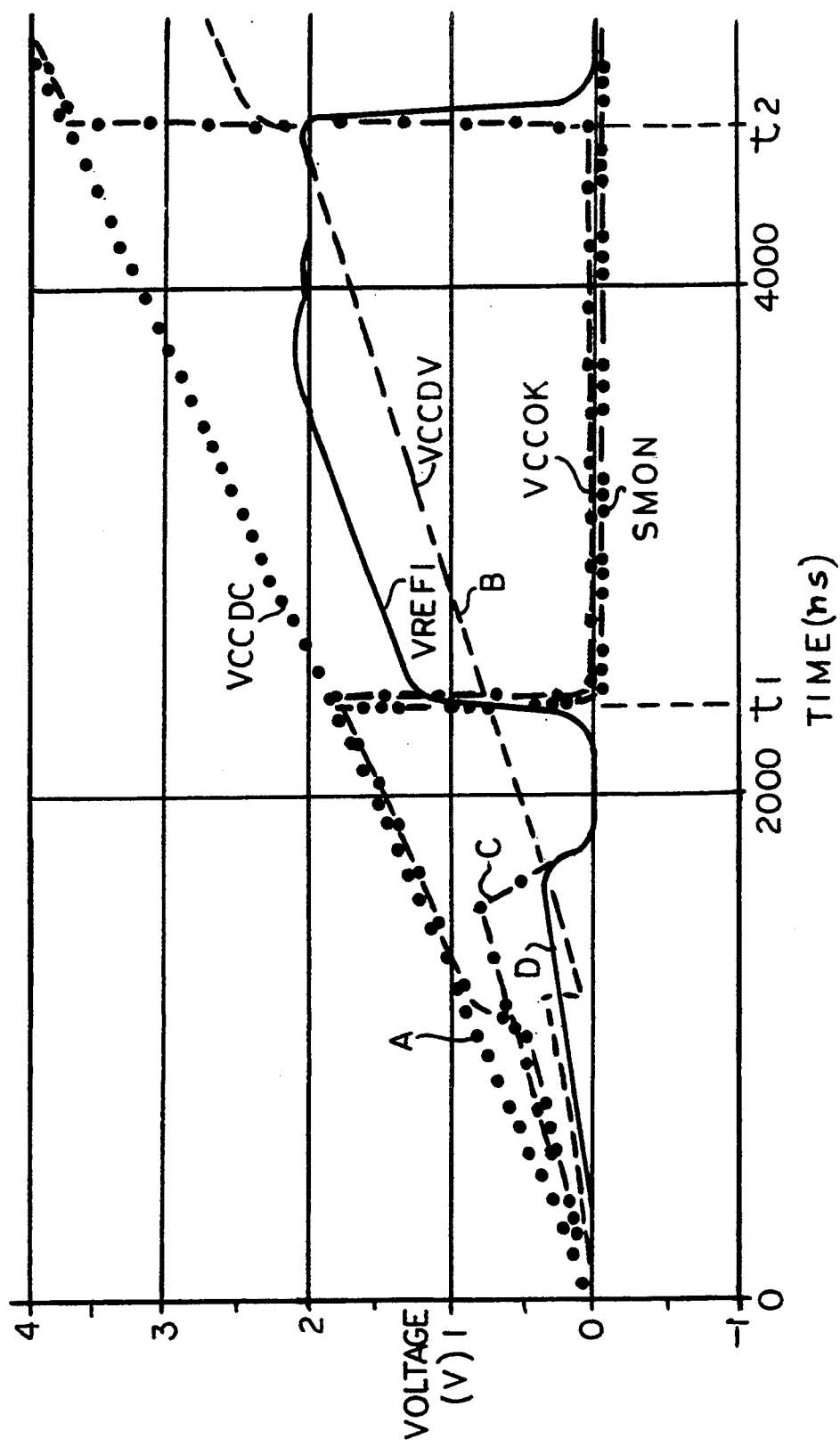
FIG. 4 are waveforms at various points in the circuit of FIG. 1, which are useful in understanding the operation thereof.

In order to provide an understanding of the operation of the power-on reset circuit 12 of the present invention, reference is now made to FIG. 4 of the drawings which illustrates waveforms at various points in the resetting circuit of FIG. 2 during a power-up mode. Initially, it will be assumed that the power supply voltage VCC applied to the first power supply node 64 is in the current-off condition or inactive state. At time tΦ, the resetting circuit 12a is powered up from the inactive or off state in which the power supply potential VCC will be ramping up towards the steady-state level of approximately +5.0 volts.

It is also assumed that at least one of the outputs of the state registers is high so as to cause the state monitoring SMON to go high. This forces the logic control signal VON to be high which turns on the resetting circuit 12a. The start-up signal VCCDC is an approximately 10 uS delay version of the power supply potential VCC due to the transistor P6 and the capacitor C3 in the reference generator circuit 38 (FIG. 3). This start-up signal VCCDC serves to limit the rate of rise of the voltage at the node 62 in order to guarantee that the resetting circuit will have sufficient time to respond and generate the reset signal VCCOK. The waveforms of the start-up signal VCCDC and VCCDV are shown in curves A and B, respectively, of FIG. 4.

As can be seen, the reset signal VCCOK and the reference voltage VREFI will initially follow the start-up signal VCCDC and are illustrated in respective curves C and D. When the start-up signal VCCDC reaches +2.0 volts at the time t1, the differential comparator 54 will be turned on and the reference voltage VREFI will jump to approximately +1.25 volts. Since the start-up signal VCCDV is at approximately +0.75 volts, the reset signal VCCOK (curve C) will go low at the time t1. This serves to reset all of the state registers (FIG. 1) so that their outputs $Q\Phi \ldots Qn$ are low. As a result, the state monitoring signal SMON (curve E) will go low.

However, the reset signal VCCOK will be maintained in the low level until the start-up signal VCCDV exceeds the reference voltage VREFI. This occurs at time t2. The trip voltage of the comparator is determined by the following equation:

$$VCCDV = VREFI \quad (1)$$

where $VCCDV = VCC \times R2/(R1+R2)$ and $VREFI = +2.0$ volts

Thus, by making the ratio $R2/(R1+R2) = 0.55$ and substituting into both sides of above equation (1), there is given:

$$VCC \times 0.55 = +2.0 \text{ volts} \quad (2)$$

Solving equation (2) for VCC, we have:

$$VCC = +2.0 \text{ volts}/0.55 = +3.64 \text{ volts} \quad (3)$$

Accordingly, when the power supply potential VCC is less than +3.64 volts, the reset signal VCCOK will be maintained low so as to reset the state registers. Since the reset signal VCCOK is low, this forces the logic control signal VON to be high so as to automatically lock the resetting signal 12a in the active mode.

After the power supply potential VCC rises to a voltage higher than +3.64 volts at the time t2, the comparator is tripped and pulls the reset signal VCCOK to the high level. This terminates the reset condition. Also, this reset signal VCCOK being high forces the control signal VON to be low, thereby turning off automatically the resetting circuit 12a so as to conserve power consumption. It will be noted that the control signal VON being low also simultaneously turns off the reference generator 38 and turns on the pull-up transistor 56 so as to clamp the reset signal VCCOK to the power supply potential VCC.

It should be appreciated that the power-on reset circuit of the present invention is active during power-up only if one of the outputs of the state registers is high (non-reset state). Otherwise, if the outputs of the state register so happens to come up in the reset state (all outputs being low), then the power-on reset circuit is never activated at all since the logic control signal VON will be low. When the state registers are powered up in the non-reset state, the reset signal VCCOK will be continued to be applied to the reset inputs of the state registers until the power supply voltage VCC has reached a predetermined level so as to insure proper operation of the logic and/or memory circuitry 18. Thereafter, the power-on reset circuit shuts itself off, thereby reducing power consumption.

From the foregoing detailed description, it can thus be seen that the present invention provides an improved power-on reset circuit for generating and maintaining a reset signal in an active low state during power-up until a power supply voltage exceeds a predetermined level. The power-on reset circuit includes a resetting circuit and a control logic circuit. Further, the power-on reset circuit is formed as part of the same monolithic semiconductor integrated circuit chip containing the logic and/or memory circuitry.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A power-on reset circuit for generating and maintaining a reset signal in an active low state during power-up until a power supply voltage exceeds a predetermined level, said reset circuit comprising in combination:

a power supply node (64) for receiving a power supply voltage (VCC);

resetting means (12a) responsive to a monitoring signal, a start-up signal, and a reference voltage for generating a reset signal which is in a active low state;

said resetting means being coupled to said power supply voltage and including a differential comparator (54) having a first input for receiving said start-up signal, a second input for receiving said reference voltage, and an output for generating said reset signal;

control logic means (12b) responsive to said monitoring signal and said reset signal for generating a logic control signal which is initially in a high state;

voltage divider means for generating said start-up signal which is coupled to the first input of said differential comparator;

said differential comparator being responsive to said control signal and being activated only after said power supply voltage has exceeded a predetermined level so as to maintain initially reset signal on its output in the low state;

the output of said differential comparator being forced to a high state after said monitoring signal has reached a low state and said start-up signal exceeds said reference voltage; and logic means (18) responsive to said reset signal for setting its output thereof to a known state and for generating said monitoring signal.

2. A power-on reset circuit as claimed in claim 1, wherein said control signal is forced to a low state after the output of said differential comparator is in the high state, thereby automatically disabling said resetting means.

3. A power-on reset circuit as claimed in claim 1, further comprising reference generator means (38) responsive to said control signal being in the high state for generating said reference voltage and said start-up signal.

4. A power-on reset circuit as claimed in claim 3, wherein said reference generator means includes a first current source branch, a second current source branch, and an output transistor for supplying current into a resistor for generating said reference voltage.

5. A power-on reset circuit as claimed in claim 3, wherein said control signal is in the low state for automatically disabling said reference generator means.

6. A power-on reset circuit as claimed in claim 1, wherein said logic means comprises a state machine formed of state registers formed on a single monolithic semiconductor integrated circuit.

7. A power-on reset circuit as claimed in claim 6, wherein said power-on reset circuit is formed as a part of the same integrated circuit chip containing the state registers.

8. A power-on reset circuit as claimed in claim 6, wherein said logic means further includes a logic circuit having inputs connected to the output of the state registers and an output for generating said monitoring signal which is in the high state when any one of the outputs of the state registers is high.

9. A power-on reset circuit as claimed in claim 8, wherein said logic circuit is comprised of a NOR logic gate and an inverter, said NOR logic gate having its inputs coupled to the outputs of the state register and having its output connected to the input of the inverter, the output of the inverter providing the state monitoring signal.

10. A power-on reset circuit for generating and maintaining a reset signal in an active low state during power-up until a power supply voltage exceeds a predetermined level, said reset circuit comprising in combination:

a power supply node (64) for receiving a power supply voltage (VCC);

resetting means (12a) responsive to a monitoring signal, a start-up signal, and a reference voltage for generating a reset signal which is in a active low state;

said resetting means being coupled to said power supply voltage and including a differential comparator (54) having a first input for receiving said start-up signal, a second input for receiving said reference voltage, and an output for generating said reset signal;

control logic means (12b) responsive to said monitoring signal and said reset signal for generating a control signal which is initially in a high state;

said differential comparator being responsive to said control signal and being activated only after said power supply voltage has exceeded a predetermined level so as to maintain initially said reset signal on its output in the low state;

the output of said differential comparator being forced to a high state after said monitoring signal has reached a low state and said start-up signal exceeds said reference voltage; and logic means (18) responsive to said reset signal for setting its output thereof to a known state and for generating said monitoring signal.

11. A power-on reset circuit as claimed in claim 10, wherein said control signal is forced to a low state after the output of said differential comparator is in the high state, thereby automatically disabling said resetting means.

12. A power-on reset circuit as claimed in claim 10, further comprising reference generator means (38) responsive to said control signal being in the high state for generating said reference voltage and said start-up signal.

13. A power-on reset circuit as claimed in claim 12, wherein said reference generator means includes a first current source branch, a second current source branch, and an output transistor for supplying current into a resistor for generating said reference voltage.

14. A power-on reset circuit as claimed in claim 12, wherein said control signal is in the low state for automatically disabling said reference generator means.

15. A power-on reset circuit as claimed in claim 10, wherein said logic means comprises a state machine formed of state registers formed on a single monolithic semiconductor integrated circuit.

16. A power-on reset circuit as claimed in claim 15, wherein said power-on reset circuit is formed as a part of the same integrated circuit chip containing the state registers.

17. A power-on reset circuit as claimed in claim 15, wherein said logic means further includes a logic circuit having inputs connected to the output of the state registers and an output for generating said monitoring signal which is in the high state when any one of the outputs of the state registers is high.

18. A power-on reset circuit as claimed in claim 17, wherein said logic circuit means is comprised of a NOR logic gate and an inverter, said NOR logic gate having its inputs coupled to the outputs of the state register and having its output connected to the input of the inverter, the output of the inverter providing the state monitoring signal.

19. A power-on reset circuit for generating and maintaining a reset signal in an active low state during power-up until a power supply voltage exceeds a predetermined level, said reset circuit comprising in combination:

a power supply node (64) for receiving a power supply voltage (VCC);

resetting means (12a) responsive to a monitoring signal, a start-up signal, and a reference voltage for generating a reset signal which is in a active low state;

said resetting means being coupled to said power supply voltage and including a differential comparator (54) having a first input for receiving said start-up signal, a second input for receiving said reference voltage, and an output for generating said reset signal;

control logic means (12b) responsive to said monitoring signal and said reset signal for generating a control signal which is initially in a high state;

said differential comparator being responsive to said control signal and being activated only after said power supply voltage has exceeded a predetermined level so as to maintain initially said reset signal on its output in the low state; and the output of said differential comparator being forced to a high state after said monitoring signal has reached a low state and said start-up signal exceeds said reference voltage.

20. A power-on reset circuit as claimed in claim 19, further comprising reference generator means (38) responsive to said control signal being in the high state for generating said reference voltage and said start-up signal.

* * * * *